US009142677B2

(12) United States Patent
Zhu

(10) Patent No.: US 9,142,677 B2
(45) Date of Patent: Sep. 22, 2015

(54) FINFET HAVING GATE IN PLACE OF SACRIFICIAL SPACER SOURCE/DRAIN MASK

(71) Applicant: INSTITUTE OF MICROELECTRONICS, CHINESE ACADEMY OF SCIENCES, Beijing (CN)

(72) Inventor: Huilong Zhu, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 14/223,950

(22) Filed: Mar. 24, 2014

(65) Prior Publication Data

US 2014/0231917 A1   Aug. 21, 2014

Related U.S. Application Data

(63) Continuation of application No. PCT/CN2012/086539, filed on Dec. 13, 2012.

(30) Foreign Application Priority Data

Dec. 6, 2012   (CN) .......................... 2012 1 0520026

(51) Int. Cl.
*H01L 21/8234* (2006.01)
*H01L 21/8238* (2006.01)
*H01L 29/78* (2006.01)
*H01L 29/66* (2006.01)

(52) U.S. Cl.
CPC ...... *H01L 29/7853* (2013.01); *H01L 29/66795* (2013.01); *H01L 29/66803* (2013.01)

(58) Field of Classification Search
CPC ............... H01L 21/823431; H01L 21/823821; H01L 29/66795; H01L 29/7853; H01L 29/6681
USPC ........................................................ 438/306
See application file for complete search history.

(56) References Cited

U.S. PATENT DOCUMENTS

| 2003/0127690 | A1  | 7/2003  | Bryant et al. |  |
|---|---|---|---|---|
| 2004/0266077 | A1  | 12/2004 | Yeo et al. |  |
| 2008/0164537 | A1* | 7/2008  | Cai ............................... | 257/408 |
| 2008/0277745 | A1  | 11/2008 | Hsu et al. |  |
| 2009/0197383 | A1  | 8/2009  | Kim et al. |  |
| 2009/0224357 | A1* | 9/2009  | Juengling ..................... | 257/506 |
| 2012/0313170 | A1* | 12/2012 | Chang et al. .................. | 257/347 |
| 2014/0027816 | A1* | 1/2014  | Cea et al. ...................... | 257/192 |

FOREIGN PATENT DOCUMENTS

CN          100580888 C        1/2010

OTHER PUBLICATIONS

International Search Report and Written Opinion dated Aug. 22, 2013, issued in International Appl. No. PCT/CN2012/086539, filed Nov. 12, 2012, with accompanying translation of Box V of the Written Opinion.

* cited by examiner

*Primary Examiner* — Kevin Parendo
(74) *Attorney, Agent, or Firm* — Knobbe Martens Olson & Bear LLP

(57) ABSTRACT

A FinFET and a method for manufacturing the same are disclosed. In one aspect, the method comprises forming a semiconductor fin having trapezoid cross-section. The method also includes forming one of a source region and a drain region. The method also includes forming a sacrificial spacer. The method also includes forming another one of the source region and the drain region using the sacrificial spacer as a mask. The method also includes removing the sacrificial spacer. The method also includes forming a gate stack in place of the sacrificial spacer, the gate stack comprising a gate conductor and a gate dielectric isolating the gate conductor from the semiconductor fin.

4 Claims, 14 Drawing Sheets

FINFET HAVING GATE IN PLACE OF SACRIFICIAL SPACER SOURCE/DRAIN MASK

This application claims priority to International Application No. PCT/CN2012/086539, filed on Dec. 13, 2012, entitled "FINFET AND METHOD FOR MANUFACTURING THE SAME," and Chinese Application No. 201210520026.X, filed on Dec. 6, 2012, which are incorporated herein by reference in their entirety.

BACKGROUND

1. Field

The disclosed technology relates to semiconductor technology, and particularly, to a FinFET and a method for manufacturing the same.

2. Description of the Related Technology

With size reduction of planar-type semiconductor devices, short-channel effect becomes increasingly obvious. In order to address problems caused by the short channel effect, three-dimensional semiconductor devices such as Fin Field Effect Transistors (FinFETs) have been proposed. The FinFET comprises a semiconductor fin forming a channel region and a gate stack covering at least a sidewall of the semiconductor fin. The gate stack intersects the semiconductor fin and comprises a gate conductor and a gate dielectric. The gate dielectric isolates the gate conductor from the semiconductor fin. The FinFET may have a double-gate, a tri-gate, or an annular-gate configuration. The semiconductor fin has a small width (i.e., thickness), and thus the FinFET can improve control of carriers in the channel region by the gate conductor and suppress the short-channel effect. Conventional processes for manufacturing the gate stack comprises depositing a dielectric layer and a conductive layer and then forming a pattern of the gate stack through photolithography. However, with the size reduction of the devices, it becomes increasingly difficult to form a gate with a small size (i.e., gate length) along a length direction of the semiconductor fin.

Therefore, it is desired to provide a method for manufacturing a semiconductor device with a small gate size.

SUMMARY OF CERTAIN INVENTIVE ASPECTS

In view of the above-described problems in the art, the disclosed technology includes, among others, a FinFET with a small gate size and a method for manufacturing the same.

One aspect of the disclosed technology includes a method of manufacturing a FinFET comprising forming a semiconductor fin having trapezoid cross-section. The method further includes forming one of a source region and a drain region. The method further includes forming a sacrificial spacer. The method further includes forming another one of the source region and the drain region using the sacrificial spacer as a mask. Then removing the sacrificial spacer. The method further includes forming a gate stack in place of the sacrificial spacer, the gate stack comprising a gate conductor and a gate dielectric isolating the gate conductor from the semiconductor fin.

Another aspect of the disclosed technology includes a FinFET. The FinFET includes a semiconductor fin having a trapezoid cross-section. The FinFET also includes a source region and a drain region in the semiconductor fin. The FinFET also includes a mask layer arranged on one of the source region and the drain region and having a sidewall facing another one of the source region and the drain region. The FinFET also includes a gate stack arranged between the source region and the drain region and comprising a gate conductor and a gate dielectric isolating the gate conductor from the semiconductor fin.

The method according to the disclosed technology may implement a gate length much shorter than that of a conventional FinFET by forming the gate stack using the sacrificial spacer. The semiconductor fin has a trapezoid cross-section, which makes it possible to form the sacrificial spacer with a reduced thickness. Accordingly, negative effects on the semiconductor fin by etching in forming the sacrificial spacer can be alleviated. Also, general alignment between the gate stack and the source and drain regions can be achieved by forming the other one of the source region and the drain region using the sacrificial spacer as the mask. The disclosed technology may reduce usage of masks and complex photolithography and thus reduce manufacturing cost.

BRIEF DESCRIPTION OF THE DRAWINGS

The foregoing and other objects, features, and advantages of the disclosed technology will become more apparent from the following description of embodiments when read in conjunction with the accompanying drawings, in which.

DETAILED DESCRIPTION OF CERTAIN ILLUSTRATIVE EMBODIMENTS

Figure 1:
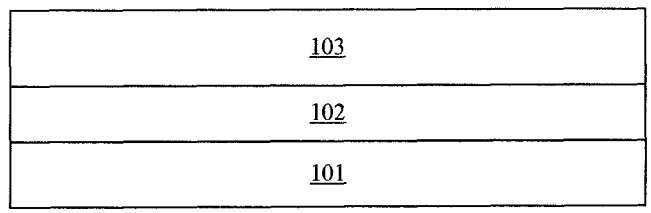
FIGS. 1-3, 4A, 4B, 4C, 5A, 5B, 5C, 6A, 6B, 6C, 7A, 7B, 7C, 8A, 8B, 8C, 9A, 9B, 9C, 10A, 10B, and 10C schematically illustrate a process flow for manufacturing a FinFET in accordance with an embodiment of the disclosed technology.

Next, the disclosed technology will be explained in detail with reference to the drawings. Similar components throughout the drawings are indicated by similar reference numbers. The drawings are not drawn to scale for purpose of clarity.

A semiconductor structure obtained after several steps may be illustrated in a single figure for conciseness.

It will be understood that, in describing a structure of a device, when a layer or region is referred to as being arranged "on" or "above" another layer or region, the layer or region may be directly on or above the other layer region, or there may be one or more other layers or regions sandwiched therebetween. When the device is turned over, the layer or region will be "under" or "below" the other layer or region. If the layer or region is to be directly arranged on the other layer or region, it will be described as "directly on" or "on and in contact with" the other layer or region.

In the disclosed technology, terminology "semiconductor structure" generally refers to a structure that has been formed after respective steps in manufacturing the semiconductor device and comprises all of the layers or regions that have been formed. Various specific details of the disclosed technology, such as structures, materials, sizes, and manufacturing processes and technologies of the device, will be described in the following to facilitate understanding of the disclosed technology. However, one of ordinary skill in the art will understand that the disclosed technology can be implemented without these specific details.

Unless otherwise particularly indicated, respective parts of a FinFET can be formed of materials well known to one of ordinary skill in the art. A semiconductor material may comprise a III-V Group semiconductor material, such as any one of GaAs, InP, GaN, and SiC, or a IV Group semiconductor material, such as Si or Ge. A gate conductor may comprise any conductive material, such as metal, doped polysilicon, a stack of metal and doped polysilicon, or any other conductive material including, e.g., any one of TaC, TiN, TaTbN, TaErN, TaYbN, TaSiN, HfSiN, MoSiN, RuTa$_x$, NiTa$_x$, MoN$_x$, TiSiN, TiCN, TaAlC, TiAlN, TaN, PtSi$_x$, Ni$_3$Si, Pt, Ru, Ir, Mo, HfRu, and RuO$_x$. The gate conductor may also be any combination of the foregoing conductive materials. A gate dielectric may comprise SiO$_2$ or any other material having a dielectric constant larger than that of SiO$_2$. Such material may comprise, e.g., any one of oxide, nitride, oxynitride, silicide, aluminate, and titanate. The oxide may comprise, e.g., any one of SiO$_2$, HfO$_2$, ZrO$_2$, Al$_2$O$_3$, TiO$_2$, and La$_2$O. The nitride may comprise, e.g., Si$_3$N$_4$. The silicide may comprise, e.g., HfSiO$_x$. The aluminate may comprise, e.g., LaAlO$_3$. The titanate may comprise, e.g., SrTiO$_3$. The oxynitride may comprise, e.g., SiON. The gate dielectric may comprise any suitable material well known to one of ordinary skill in the art or any suitable material that might be invented in the future.

In conventional Gate-Last process (also called Replacement Gate Process), source and drain regions are formed in a substrate using a "dummy" gate stack and two spacers on opposite sides of the dummy gate stack. An opening is formed between the spacers by removing the dummy gate. A real gate stack is then formed by filling the opening. Different from this process, the disclosed technology provides a so-called "Replacement Spacer" process. In such a process, after the source and drain regions are formed, a material layer on one of the source and drain regions is retained. A gate stack, in particular, a gate conductor, is formed as a spacer on a sidewall of the retained material layer. In this way, the gate stack can be formed on a relatively large area, in particular, an area including a gate region and another one of the source and drain regions. The process is easier than the conventional process in which the gate stack is formed in a relatively small gate opening sandwiched between the spacers.

The disclosed technology can be implemented in various ways, some examples of which will be described as follows.

FIGS. 1 to 10 schematically illustrate respective steps for implementing a method in accordance with an embodiment of the disclosed technology. FIGS. 4C, 5C, 6C, 7C, 8C, 9C, and 10C show respective top views and positions where sectional views are to be taken. FIGS. 1-3, 4A, 5A, 6A, 7A, 8A, 9A, and 10A show respective sectional views taken along an A-A line in a width direction of a semiconductor fin. FIGS. 4B, 5B, 6B, 7B, 8B, 9B, and 10B show respective sectional views taken along a B-B line in a length direction of the semiconductor fin.

Referring to FIG. 1, a conventional SOI wafer is used as a semiconductor substrate for an initial structure. The SOI wafer comprises, from bottom to top, a semiconductor substrate 101, an insulating buried layer 102, and a semiconductor layer 103 in sequence. The semiconductor layer 103 may have a thickness of, e.g., about 5 nm~20 nm, such as 10 nm or 15 nm. The insulating buried layer 102 may have a thickness of, e.g., about 5 nm~30 nm, such as 10 nm, 15 nm, 20 nm, or 25 nm.

The semiconductor substrate 101 may comprise any one of body silicon, a IV Group semiconductor material, such as SiGe or Ge, and a III-V Group compound semiconductor material such as GaAs.

The insulating buried layer 102 may comprise any one of oxide, oxynitride, and any other suitable insulating material.

The semiconductor layer 103 may be used to form a semiconductor fin of a FinFET and provide a source region, a drain region, and a channel region of the FinFET. The semiconductor layer 103 may comprise a IV Group semiconductor material, such as Si, Ge, or SiGe, or a III-V Group compound semiconductor material, such as GaAs. In this embodiment, the semiconductor layer 103 may be monocrystal silicon or SiGe.

The SOI wafer may be prepared by any known process, e.g., the SmartCut™ process. The process comprises bonding two wafers, each comprising an oxide surface formed by thermal oxidation or deposition, with each other. One of the two wafers has been subjected to hydrogen implantation to form a hydrogen implantation region in a silicon body at a certain depth below the oxide surface layer. The hydrogen implantation region then is changed into a micro-cavity layer under a high pressure and a high temperature, which helps to separate portions on two opposite sides of the micro-cavity layer. One resultant portion that comprises the bonded oxide surface layer is used as the SOI wafer. The SOI wafer thus obtained has a buried insulating layer, a thickness of which can be changed by controlling process parameters of the thermal oxidation or deposition. The SOI wafer also has a semiconductor layer, a thickness of which can be changed by controlling energy of the hydrogen implantation.

Figure 2:
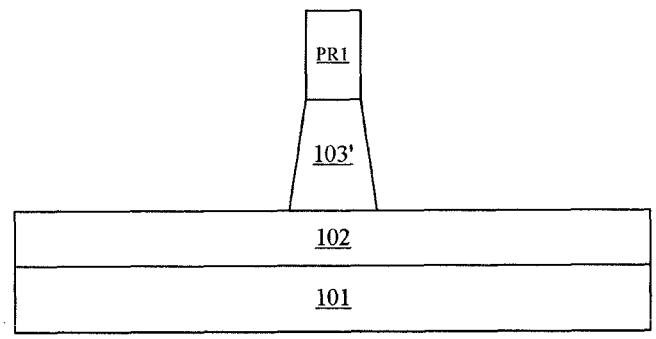

Next, the semiconductor layer 103 is patterned into a semiconductor fin 103', as shown in FIG. 2. The patterning may comprise forming a patterned photoresist mask PR1 on the semiconductor layer 103 by photolithography comprising exposure and development. Exposed portions of the semiconductor layer 103 are removed through dry etching, such as any one of ion milling, plasma etching, reactive ion etching, and laser ablation, or wet etching using an etching agent. The etching stops at a top of the insulating buried layer 102.

The semiconductor fin 103' is formed to have a trapezoid cross-section with a bottom longer than its top by selecting the suitable etching agent and etching condition. The trapezoid shape helps to etch a sacrificial spacer in a subsequent step.

Figure 3:
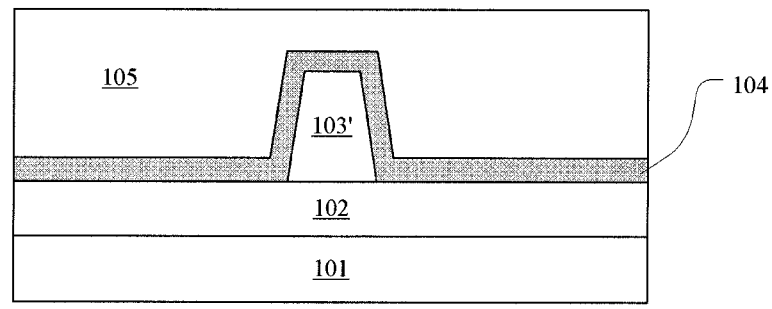

Next, the photoresist mask PR1 is removed by being ashed or dissolved in a solution. Then an oxide layer 104 and a first mask layer 105, e.g., a silicon nitride layer, are formed conformally on the semiconductor structure by a known deposition process, such as any one of Chemical Vapor Deposition (CVD), Physical Vapor Deposition (PVD), Atom Layer Deposition, sputtering, etc., as shown in FIG. 3. A surface of the semiconductor structure is planarized by Chemical Mechanical Polishing (CMP). Only a portion of the first mask layer 105 is removed by the CMP by controlling the time so that the CMP does not reach the oxide layer 104. The remaining portion of the first mask layer 105 has a thickness sufficient to provide a sidewall for forming the sacrificial spacer on the semiconductor fin 103'. The first mask layer 105 also provides mechanical support to the semiconductor fin 103'. The thickness of the remaining portion of the first mask layer 105 is at least about two times of the height of the semiconductor fin 103'.

The trapezoid cross-section of the semiconductor fin 103' may help to form the sacrificial spacer with a relatively small thickness of the first mask layer 105. As a result, etching time can be reduced to avoid undesired over-etching of the semiconductor fin 103'.

Figure 4A:
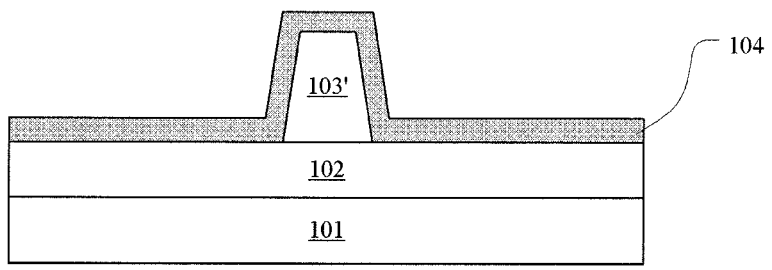
Figure 4B:
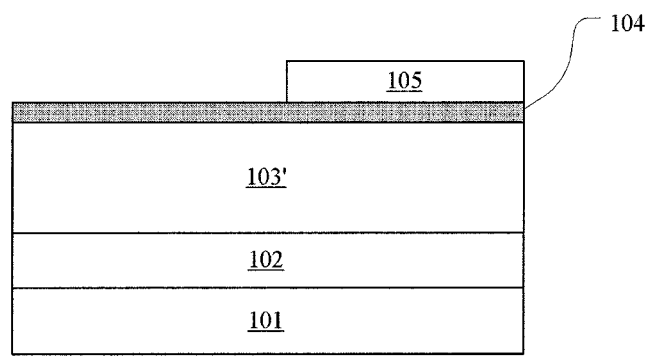
Figure 4C:
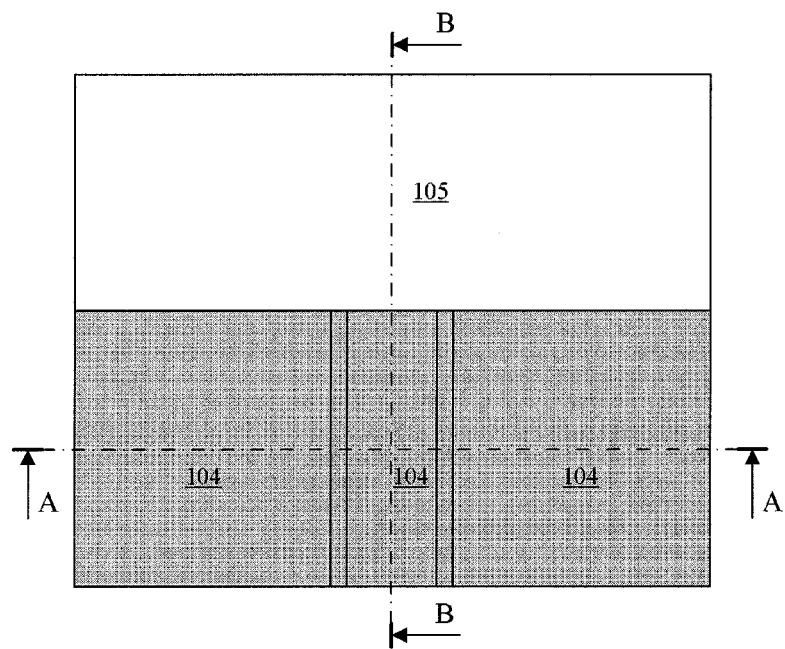

Next, the first mask layer 105 is patterned using a photoresist mask to expose a portion of the semiconductor fin 103', which will be used in forming one of the source region and the drain region, as shown in FIGS. 4A, 4B, and 4C. In the patterning, exposed portions of the first mask layer 105 are etched away with respect to the oxide layer 104. The patterned first mask layer 105 has a sidewall extending along a direction perpendicular to a length direction of the semiconductor fin 103'.

Figure 5A:
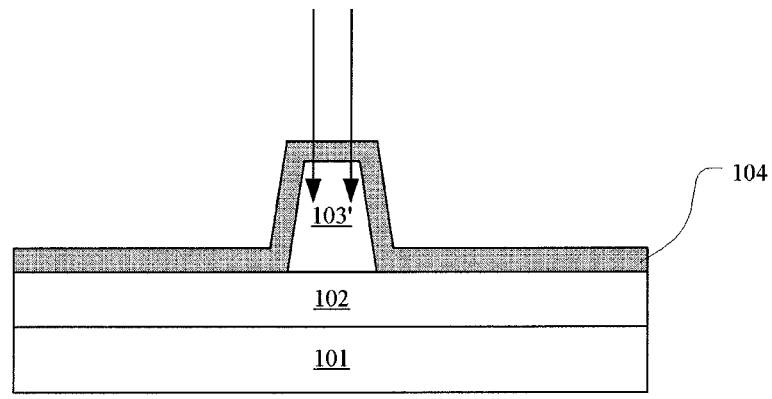
Figure 5B:
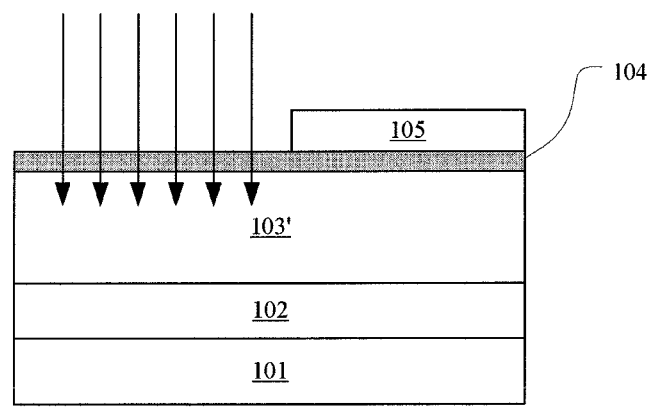
Figure 5C:
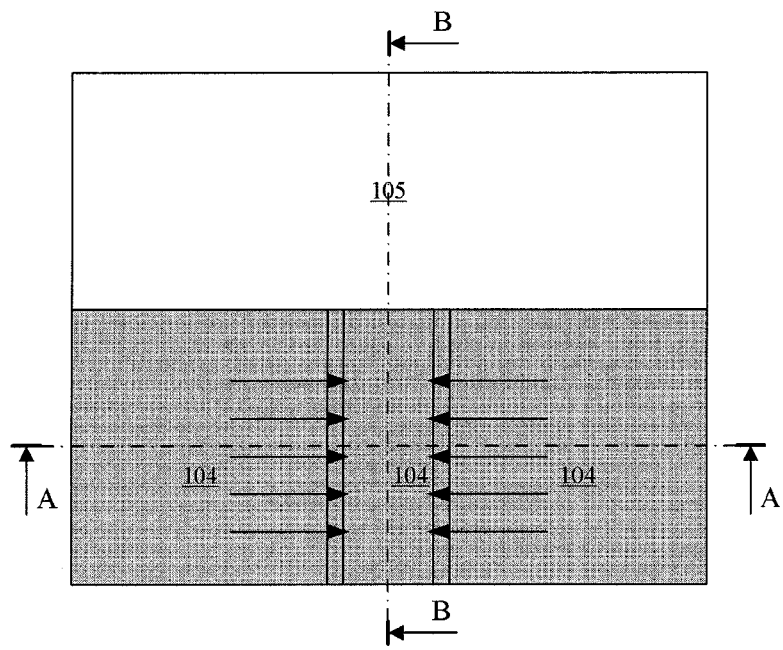

Then, one of the source region and the drain region (not shown) is formed by conducting a first ion implantation in the semiconductor fin 103' using the first mask layer 105 as a hard mask, as shown in FIGS. 5A, 5B, and 5C. During the first ion implantation, for a p-type device, p-type dopants such as In, $BF_2$, or B may be implanted, while for an n-type device, n-type dopants such as As or P may be implanted.

Additional ion implantations may be conducted to form extension and halo regions if desired. During the additional ion implantation for forming the extension region, for the p-type device, the p-type dopants as described above can be implanted, while for the n-type device, the n-type dopants as described above can be implanted. During the additional ion implantation for forming the halo region, for the p-type device, the n-type dopants as described above can be implanted, while for the n-type device, the p-type dopants as described above can be implanted.

Optionally, after the first ion implantation, the implanted dopants may be activated by annealing such as peak annealing, laser annealing, or rapid annealing.

Figure 6A:
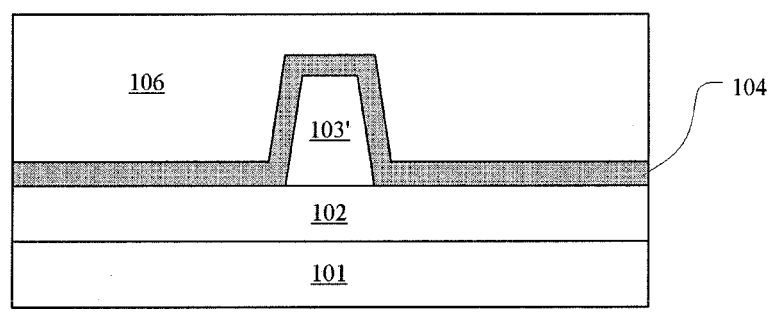
Figure 6B:
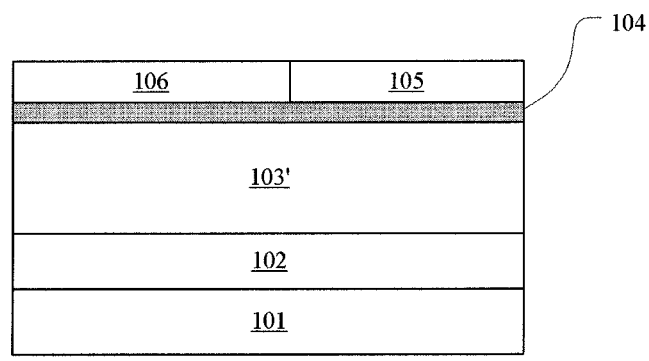
Figure 6C:
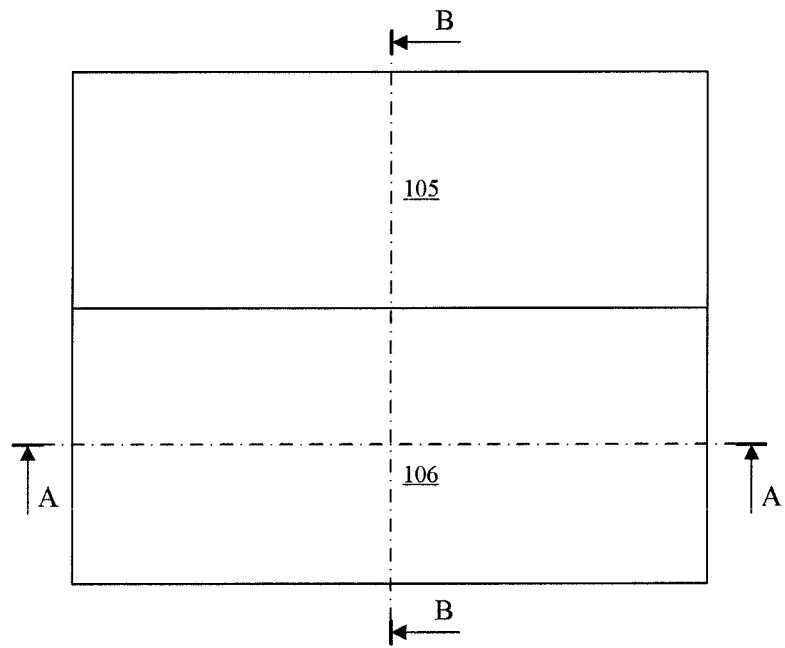

Next, a second mask layer 106, e.g. a $SiO_2$ layer, is deposited on the semiconductor structure through the known deposition process as described above. Then the semiconductor structure is planarized by, e.g., CMP, as shown in FIGS. 6A, 6B, and 6C. The CMP stops at the first mask layer 105. As a result, the second mask layer 106 and the first mask layer 105 adjoin each other and cover a portion of the semiconductor fin 103' where the one of the source and drain regions has been formed and another portion of the semiconductor fin 103' where another one of the source and drain regions are to be formed, respectively.

Figure 7A:
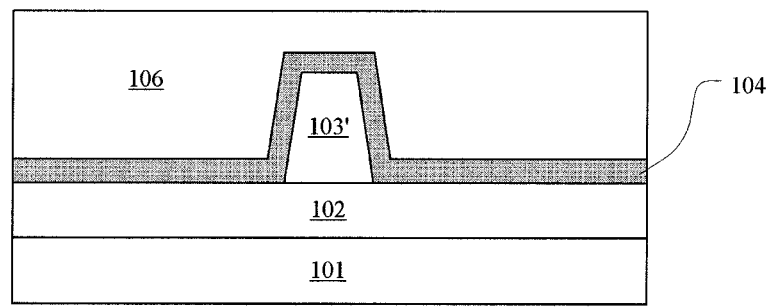
Figure 7B:
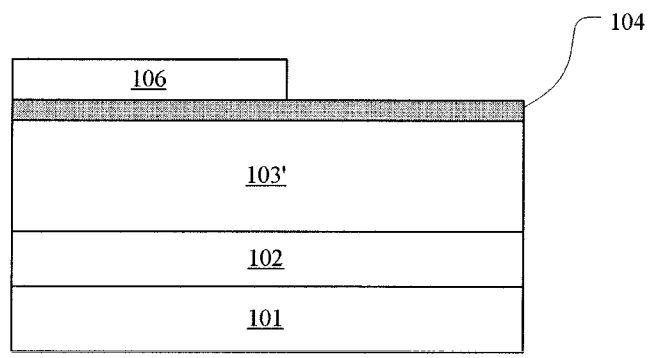
Figure 7C:
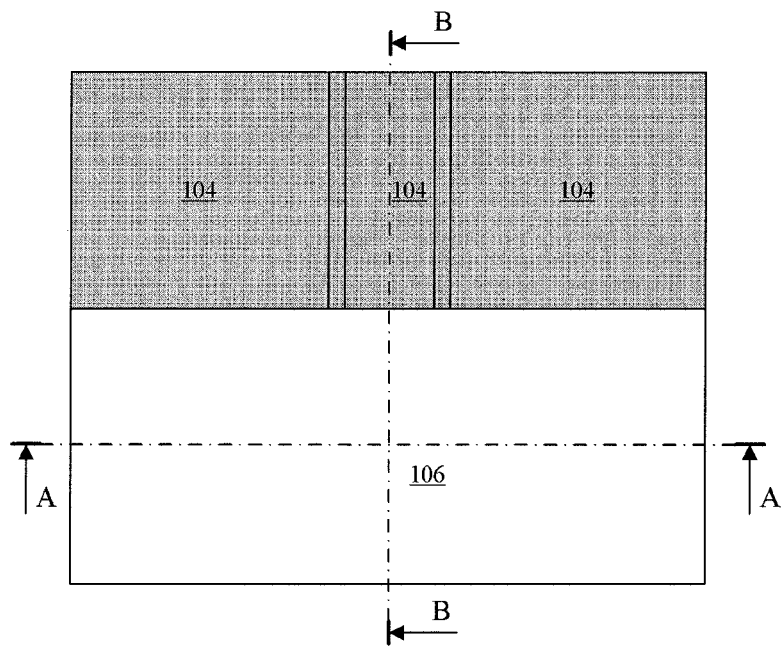

Then, the first mask layer 105 is selectively removed with respect to the adjoining second mask layer 106 and the oxide layer 104 under the first mask layer 105 through dry etching such as RIE or wet etching, as shown in FIGS. 7A, 7B, and 7C. A sidewall of the second mask layer 106 is exposed through the etching. No additional photoresist mask is necessary.

Figure 8A:
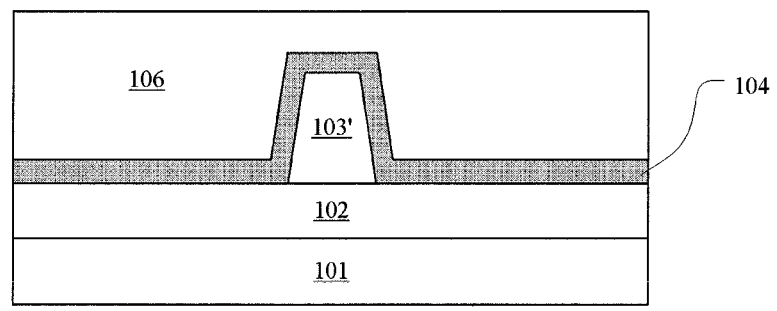
Figure 8B:
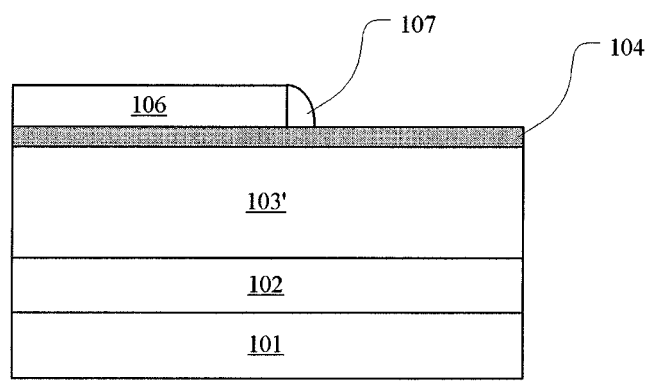
Figure 8C:
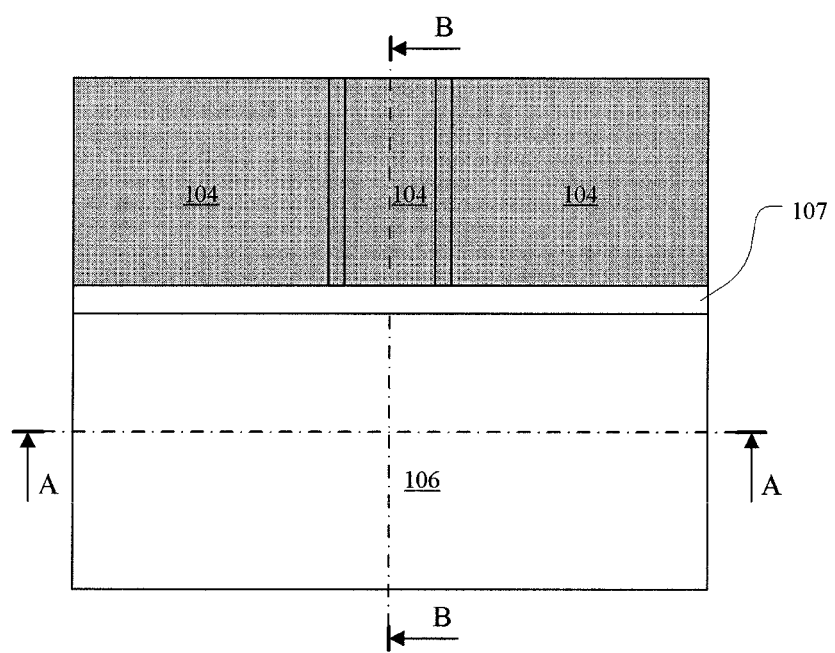

After that, a nitride layer having a thickness of about 10 nm~50 nm is deposited on the semiconductor structure through the known deposition process as described above. A sacrificial spacer 107 is then formed on the sidewall of the second mask layer 106 through anisotropic etching, as shown in FIGS. 8A, 8B, and 8C. Material and process for forming the sacrificial spacer 107 may be the same as those for a conventional gate spacer, respectively. The sacrificial spacer 107 extends along a direction perpendicular to the length direction of the semiconductor fin 103'. As described below, the sacrificial spacer 107 will be finally removed and replaced by a gate stack.

Figure 9A:
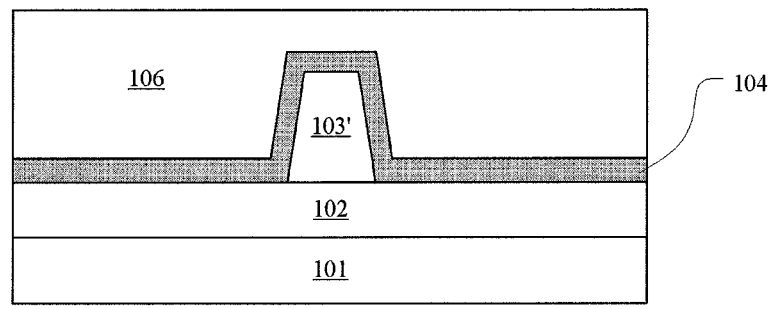
Figure 9B:
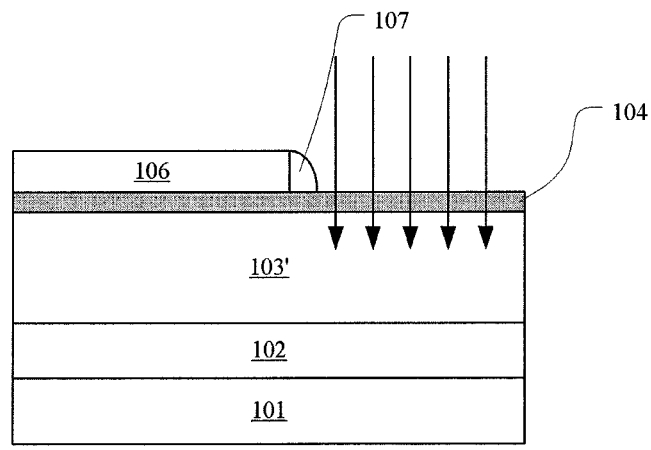
Figure 9C:
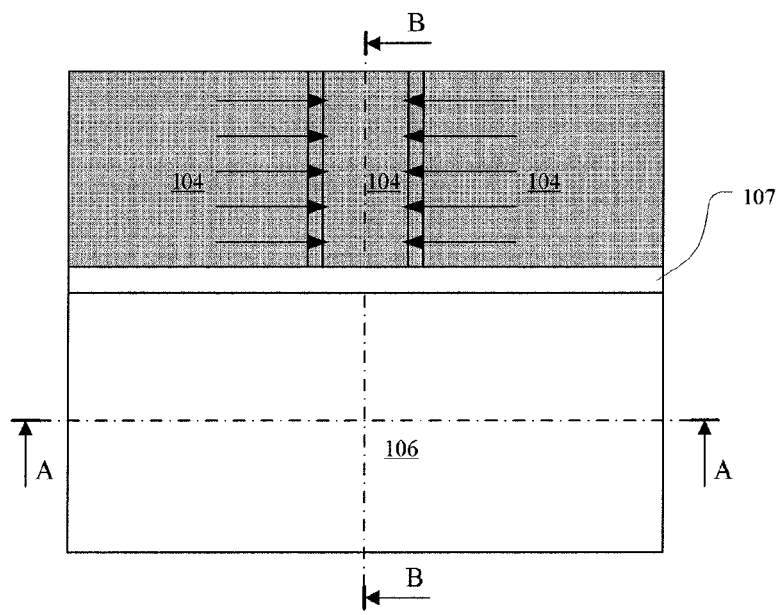

Then, the other one of the source and drain regions (not shown) is formed through a second ion implantation in the semiconductor fin 103' using the second mask layer 106 and the sacrificial spacer 107 as a hard mask, as shown in FIGS. 9A, 9B, and 9C. During the second ion implantation, for the p-type device, the p-type dopants as described above can be implanted, while for the n-type device, the n-type dopants as described above can be implanted.

Additional ion implantations may be conducted to form extension and halo regions if desired. During the additional ion implantation for forming the extension region, for the p-type device, the p-type dopants as described above can be implanted, while for the n-type device, the n-type dopants as described above can be implanted. During the additional ion implantation for forming the halo region, for the p-type device, the n-type dopants as described above can be implanted, while for the n-type device, the p-type dopants as described above can be implanted.

Optionally, after the second ion implantation, the implanted dopants may be activated by annealing such as peak annealing, laser annealing, or rapid annealing.

Next, the sacrificial spacer 107 is selectively removed with respect to the adjoining second mask layer 106 and the oxide layer 104 under the sacrificial spacer 107 through dry etching such as RIE or wet etching using a suitable etching agent, as described above. After the sacrificial spacer 107 has been completely removed, a portion of the oxide layer 104 that is not covered by the second mask layer 106 is removed using a suitable etching agent. The adjacent second mask layer 106 may also be etched when the oxide layer 104 is being etched. However, the second mask layer 106 will not be etched away completely except for a little thickness reduction because it has a thickness much larger than that of the oxide layer 104. Etching of the oxide layer 104 may be implemented by controlling the time.

Figure 10A:
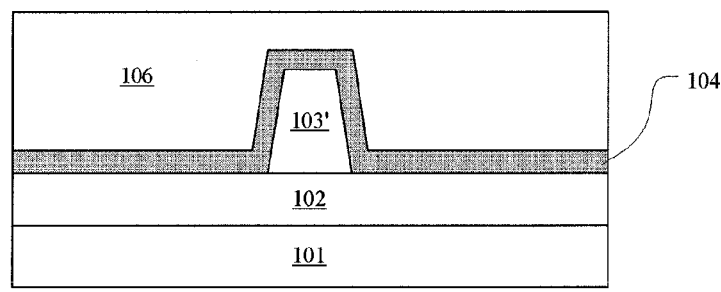
Figure 10B:
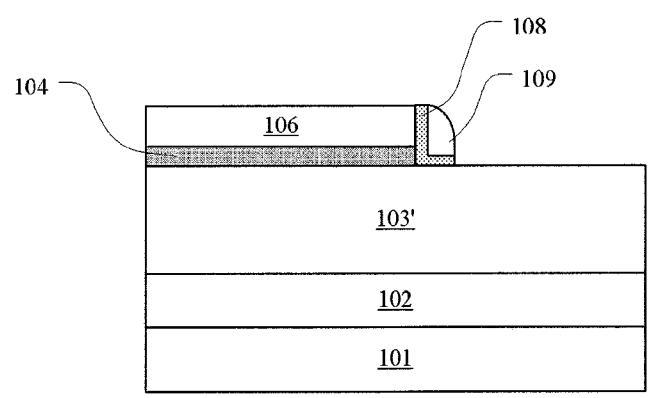
Figure 10C:
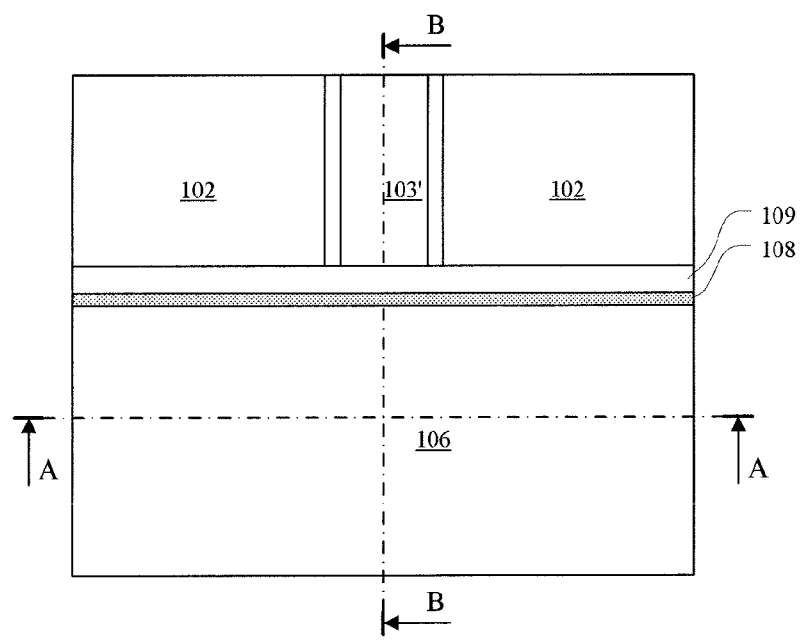

After that, a dielectric layer, e.g., a $HfO_2$ layer, and a gate conductive layer, e.g., a polysilicon layer, are formed conformally on the semiconductor structure through known deposition processes. The conductive layer is subjected to anisotropic etching to remove a portion that extends in parallel to a main surface of the semiconductor substrate 101. A portion of the gate conductive layer vertically extending on the sidewall of the second mask layer 106 is retained to form a gate conductor 109 in the form of a spacer. Then, exposed portions of the dielectric layer is selectively removed with respect to the gate conductor 109 and the second mask layer 106 using a suitable etching agent and the gate conductor 109 as a hard mask, so as to form a gate dielectric 108. The gate dielectric 108 and the gate conductor 109 form a gate stack. The gate dielectric 108 isolates the gate conductor 109 from the semiconductor fin 103', as shown in FIGS. 10A, 10B, and 10C.

The dielectric layer may have a thickness of about 2 nm~5 nm. The gate conductive layer may have a thickness of about 10 nm~45 nm. The gate conductor 109 is generally in alignment with the sacrificial spacer 107 as shown in FIGS. 8A, 8B, and 8C by controlling the thickness of the gate conductive layer. As a result, the gate conductor 109 is generally in alignment with an extension region 111a and the other one of the source and drain regions 111b.

Optionally, a work function adjustment layer (not shown) may also be formed between the gate conductor 109 and the gate dielectric 108. The work function adjustment layer may comprise, e.g. any one of TaC, TiN, TaTbN, TaErN, TaYbN, TaSiN, HfSiN, MoSiN, RuTa, NiTa, MoN, TiSiN, TiCN, TaAlC, TiAlN, TaN, PtSi, $Ni_3Si$, Pt, Ru, Ir, Mo, HfRu, and $RuO_x$, or any combination thereof. The work function adjustment layer may have a thickness of about 2 nm~10 nm. One of ordinary skill in the art will understand that the work function adjustment layer is optional. The gate stack comprising the work function adjustment layer, e.g., $HfO_2$/TiN/polysilicon, may advantageously achieve a decreased gate leakage current.

After the gate stack comprising the gate dielectric 108 and the gate conductor 109 is formed, a sidewall of the gate conductor 109 adjoins a sidewall of the gate dielectric 108 while other sidewall of the gate conductor 109 are exposed. A conformal nitride layer, e.g. a silicon nitride layer, may be formed on the semiconductor structure through a conventional process, such as that used for forming the sacrificial spacer 107 as described with reference to FIGS. 8A, 8B, and 8C. The nitride layer is patterned into a spacer (not shown)

through anisotropic etching. The nitride layer covers the exposed sidewall of the gate conductor 109 to electrically isolate the gate conductor 109 from the adjacent source and drain regions and conductive paths.

Next, an interlayer insulating layer, conductive paths in the interlayer insulating layer, and wiring or electrodes on the interlayer insulating layer are formed on the resultant semiconductor structure to complete the FinFET.

Figure 11:
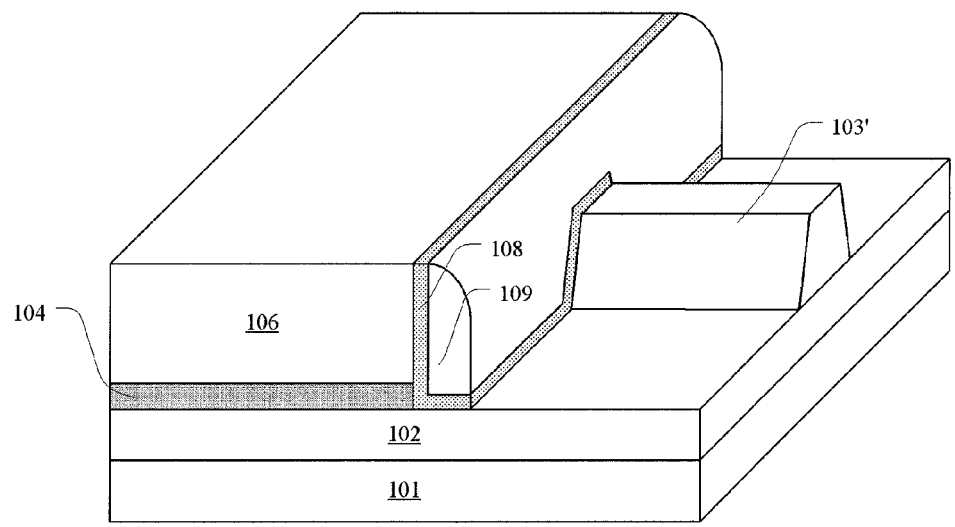
FIG. 11 schematically illustrates a perspective view of a FinFET in accordance with an embodiment of the disclosed technology.

FIG. 11 schematically illustrates a perspective view of a FinFET 100 in accordance with an embodiment of the disclosed technology. The FinFET 100 may be formed on, e.g., an SOI wafer. The SOI wafer comprises a semiconductor substrate 101, an insulating buried layer 102, and a semiconductor layer 103. The insulating buried layer 102 is sandwiched between the semiconductor substrate 101 and the semiconductor layer 103. The semiconductor fin 103' is formed from the semiconductor layer 103. The semiconductor fin 103' has a trapezoid cross-section with bottom longer than its top. The FinFET 100 has a source region and a drain region (not shown) formed in two different portions of the semiconductor fin 103'. An oxide layer 104 and a second mask layer 106 are formed on one of the source region and the drain region. The oxide layer 104 and the second mask layer 106 form a portion of an interlayer dielectric layer. The oxide layer 104 and the second mask layer 106 each have a sidewall adjoining the other one of the source region and the drain region so as to provide mechanical support to the gate stack. The gate stack comprises a gate dielectric 108 and a gate conductor 109. The gate dielectric 108 isolates the gate conductor 109 from the semiconductor fin 103'. The gate dielectric 108 comprises a first portion on a sidewall of the second mask layer 106 and a second portion on a sidewall of the semiconductor fin 103'. That is, in a plane in parallel to a length direction of the semiconductor fin 103' and passing through the semiconductor fin 103', the gate dielectric 108 has an L-shaped cross-section. The gate stack is generally in alignment with the source region and the drain region. The gate stack intersects the semiconductor fin 103' and extends, e.g., along a direction perpendicular to the length direction of the semiconductor layer 103.

Figure 12:
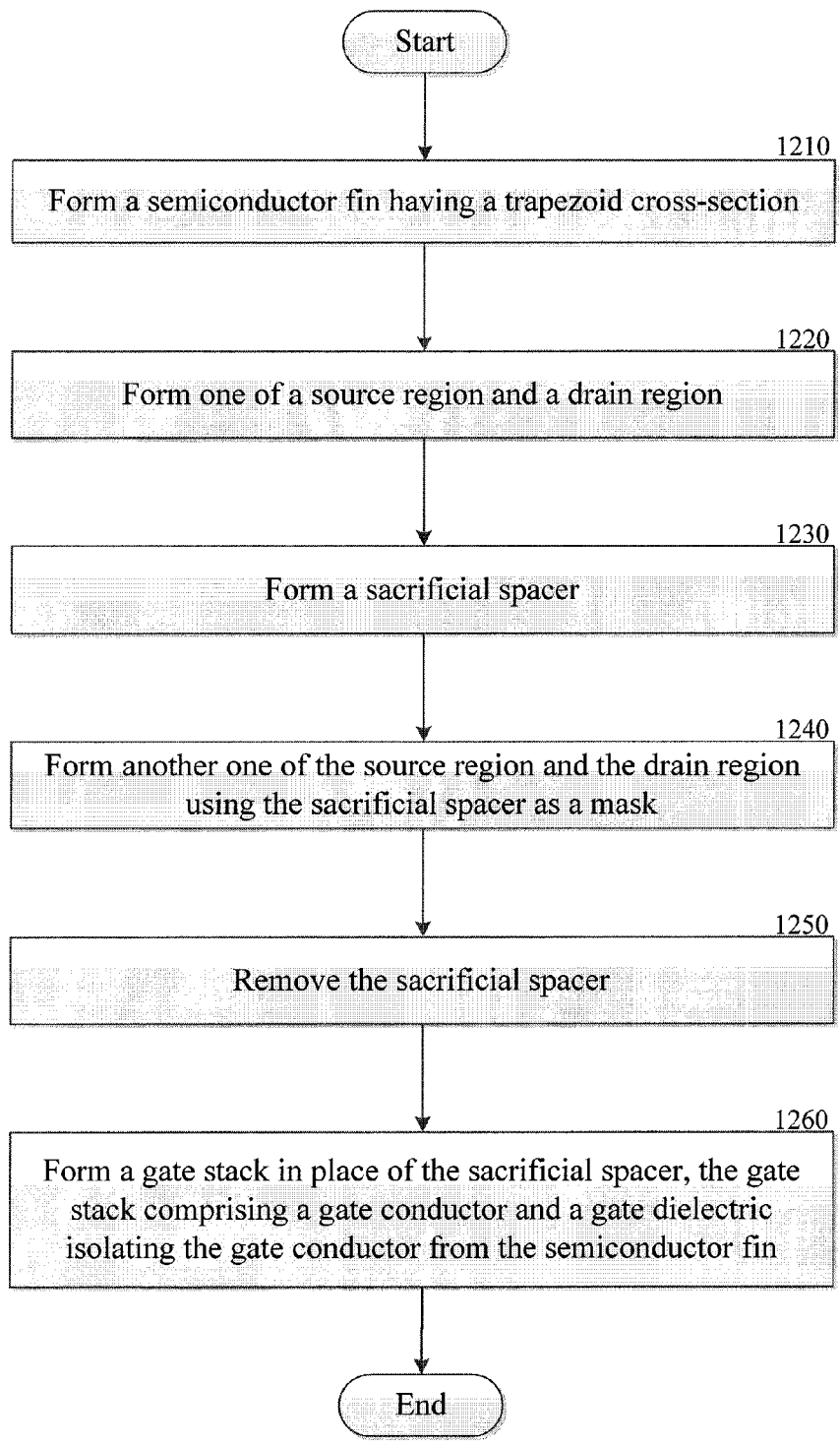
FIG. 12 is a flow chart illustrating a method of manufacturing a FinFET.

Manufacturing the FinFET shown in FIG. 11 using the process flow depicted in FIGS. 1-10 will now be described with respect to FIG. 12, which is a flow chart illustrating a method 1200 of manufacturing a FinFET. At block 1210, method 1200 forms a semiconductor fin 103' having a trapezoid cross-section. At block 1220, method 1200 forms one of a source region and a drain region. At block 1230, method 1200 forms a sacrificial spacer 107. At block 1240, method 1200 forms another one of the source region and the drain region using the sacrificial spacer 107 as a mask. At block 1250, method 1200 removes the sacrificial spacer 107. At block 1260, method 1200 forms a gate stack in place of the sacrificial spacer 107, the gate stack comprising a gate conductor 109 and a gate dielectric 108 isolating the gate conductor from the semiconductor fin 103'.

The foregoing description does not explain technical details such as patterning and etching of each layer. However, one of ordinary skill in the art will understand that layers and regions of desired shapes can be formed using various processes. Furthermore, processes different from those described above can be used to form the same structure. Features described in separate embodiments can be combined for benefit.

The embodiments of the disclosed technology have been described as above. However, these embodiments are explanatory rather than for limiting scope of the disclosed technology. The scope of the disclosed technology is defined by the attached claims and equivalents thereof. One with ordinary skill in the art will understand that various modifications and substitutions can be made to these embodiments without departing from the scope of the disclosed technology.

What is claimed is:

1. A method of manufacturing a FinFET, comprising:
    forming a semiconductor fin having a trapezoid cross-section;
    forming one of a source region and a drain region using a first mask layer as a hard mask;
    forming a sacrificial spacer, wherein forming the sacrificial spacer comprises:
        forming a second mask layer adjoining the first mask layer;
        removing the first mask layer to expose a sidewall of the second mask layer; and
        forming the sacrificial spacer on the exposed sidewall of the second mask layer;
    forming another one of the source region and the drain region using the sacrificial spacer as a mask;
    removing the sacrificial spacer; and
    forming a gate stack in place of the sacrificial spacer, the gate stack comprising:
        a gate conductor; and
        a gate dielectric isolating the gate conductor from the semiconductor fin.

2. The method according to claim 1, wherein in forming the other one of the source region and the drain region, the second mask layer covers the one of the source region and the drain region.

3. The method according to claim 1, wherein forming the gate stack in place of the sacrificial spacer comprises:
    removing the sacrificial spacer;
    forming a conformal dielectric layer;
    forming a conformal conductive layer on the dielectric layer;
    patterning the conductive layer into a gate conductor; and
    patterning the dielectric layer into a gate dielectric using the gate conductor as a mask, the gate dielectric comprising a first portion on the exposed sidewall of the second mask layer and a second portion on the semiconductor fin.

4. The method according to claim 1, wherein the gate conductor has the same thickness as that of the sacrificial spacer.

* * * * *